(12) United States Patent
Deckman et al.

(10) Patent No.: US 10,505,253 B2
(45) Date of Patent: Dec. 10, 2019

(54) SYSTEMS AND METHODS FOR MULTI-PROBE LAUNCH POWER COMBINING

(71) Applicant: Mission Microwave Technologies, LLC, Santa Fe Springs, CA (US)

(72) Inventors: Blythe C Deckman, Eastvale, CA (US); Michael P DeLisio, Jr., Monrovia, CA (US)

(73) Assignee: Mission Microwave Technologies, LLC, Santa Fe Springs, CA (US)

( * ) Notice: Subject to any disclaimer, the term of this patent is extended or adjusted under 35 U.S.C. 154(b) by 617 days.

(21) Appl. No.: 15/072,317

(22) Filed: Mar. 16, 2016

(65) Prior Publication Data

US 2016/0276730 A1    Sep. 22, 2016

Related U.S. Application Data

(60) Provisional application No. 62/133,850, filed on Mar. 16, 2015.

(51) Int. Cl.
| | |
|---|---|
| *H01P 3/00* | (2006.01) |
| *H01P 5/12* | (2006.01) |
| *H01P 5/107* | (2006.01) |
| *H03F 3/60* | (2006.01) |
| *H01P 5/02* | (2006.01) |

(52) U.S. Cl.
CPC ............ *H01P 5/12* (2013.01); *H01P 5/107* (2013.01); *H03F 3/602* (2013.01); *H01P 5/024* (2013.01)

(58) Field of Classification Search
CPC .. H01P 5/107; H01P 5/12; H01P 5/024; H03F 3/602
USPC .......................................................... 307/106
See application file for complete search history.

(56) References Cited

U.S. PATENT DOCUMENTS

| | | | |
|---|---|---|---|
| 4,446,463 A * | 5/1984 | Irzinski | H01Q 3/242 333/136 |
| 6,509,809 B1 * | 1/2003 | Lynch | H01P 5/107 333/26 |
| 6,707,348 B2 | 3/2004 | Ammar | |

(Continued)

OTHER PUBLICATIONS

K. Kom, "High-efficiency power combined amplifier," MS Thesis, University of Hawaii, Department of Electrical Engineering, Dec. 2000.

(Continued)

*Primary Examiner* — Thienvu V Tran
*Assistant Examiner* — Brian K Baxter
(74) *Attorney, Agent, or Firm* — Christopher P. Maiorana, PC

(57) ABSTRACT

A multi-probe power combiner system for equalizing the amplitude balance of an output wave signal. The system includes a plurality of power amplifiers, and each of the plurality of power amplifiers is capable of amplifying a received input wave signal. A waveguide includes a plurality of walls, an opening, and a direction of energy propagation toward the opening. A plurality of waveguide probes is coupled to the plurality of power amplifiers. Each of the plurality of waveguide probes i) is coupled to a corresponding one of the plurality of power amplifiers, ii) extends into the waveguide, and iii) includes at least one probe property that is different from at least one probe property of another one of the plurality of waveguide probes.

20 Claims, 18 Drawing Sheets

(56) References Cited

U.S. PATENT DOCUMENTS

| | | | |
|---|---|---|---|
| 6,967,543 B2 | 11/2005 | Ammar | |
| 9,065,163 B1* | 6/2015 | Wu | H01P 3/12 |
| 2002/0097109 A1* | 7/2002 | du Toit | H01P 5/107 |
| | | | 333/26 |
| 2004/0080377 A1* | 4/2004 | Chang | H01P 5/107 |
| | | | 333/26 |
| 2004/0108920 A1* | 6/2004 | Yu | H01P 1/20 |
| | | | 333/203 |
| 2007/0133083 A1* | 6/2007 | Kangaslahti | G02B 6/12004 |
| | | | 359/337 |
| 2009/0231055 A1* | 9/2009 | Lopez | H01P 5/024 |
| | | | 333/109 |
| 2011/0273228 A1* | 11/2011 | Kolias | H01P 5/10 |
| | | | 327/564 |
| 2012/0062335 A1* | 3/2012 | Sherrer | H01P 5/12 |
| | | | 333/127 |
| 2013/0127562 A1* | 5/2013 | Purden | H01L 23/66 |
| | | | 333/26 |
| 2014/0043107 A1* | 2/2014 | Niver | H01Q 13/025 |
| | | | 333/20 |
| 2016/0049710 A1* | 2/2016 | Huang | H01P 7/04 |
| | | | 333/202 |
| 2016/0181681 A1* | 6/2016 | Sarabandi | H01P 1/025 |
| | | | 333/21 R |
| 2016/0374752 A1* | 12/2016 | Hancock | A61B 18/1482 |
| | | | 606/33 |
| 2018/0131063 A1* | 5/2018 | Zhu | H01P 1/2082 |

OTHER PUBLICATIONS

Chang, et al., "W-Band Power Combiner Design," IEEE Transactions on Microwave Theory and Techniques, vol. MTT-28, No. 4, Apr. 1980, 295-305.

Zhou, et al., "A Ka-band power amplifier based on double-probe microstrip to waveguide transition," Progress in Electromagnetics Research Symp. Proc., Mar. 2010, pp. 1521-1525.

Yin, et al., "A Full Ka-band Waveguide-based Spatial Power-combining Amplifier Using E-Plane Anti-phase Probes," 2014 IEEE Int. Wireless Symp., Mar. 2014.

Chang, et al., "Millimeter-Wave Power-Combining Techniques," IEEE Transactions on Microwave Theory and Techniques, vol. MTT-31, No. 2, Feb. 1983, 91-107.

\* cited by examiner

SYSTEMS AND METHODS FOR MULTI-PROBE LAUNCH POWER COMBINING

CROSS-REFERENCE TO RELATED APPLICATION

This application is the nonprovisional application of provisional application, Ser. No. 62/133,850, filed on Mar. 16, 2015, which is incorporated by reference in its entirety herein.

FIELD OF INVENTION

This disclosure generally relates to waveguide probe-launch power combining, and more specifically, to a multi probe-launch power combiner system that allows for equalizing the amplitude of a combined output wave signal among multiple probes.

BACKGROUND

Many applications of microwave (1-30 GHz) and millimeter wave (30-300 GHz) technology use either solid-state or vacuum-tube components to generate or amplify the microwave or millimeter-wave signals. The applications for microwave and millimeter-wave technology often require output powers that are higher that the power that can be generated by a single component. Because the output power of a single amplifying element is often not strong enough, the outputs of many amplifying elements must be combined. One method of power combining several devices is to use a probe-fed waveguide launch (i.e., a waveguide probe) that is coupled to one or more power amplifiers and generally launch or direct an amplified wave into a waveguide. In this case, conventional waveguide designers have combined multiple probes in one waveguide to combine the power amplification of each probe and to propagate a high powered wave signal.

This conventional power combining technique includes combining the output power from multiple power amplifiers in a waveguide via corresponding probes which are identical in terms of size, material used, the depth of each probe, etc. Because a power combiner generally achieves best performance when all power amplifiers and corresponding probe launches contribute equally to form a combined power wave signal, conventional power combiners employ symmetry in positioning each probe within the waveguide. In other words, a combined wave signal performs best ideally when each amplifier coupled to each corresponding probe is saturating at the same time, and in conventional combiners, each probe is symmetrically positioned in the waveguide in such a way to achieve this end.

As an example of each probe contributing equally to the combined power wave signal, FIG. 1a illustrates a longitudinal cross section (i.e., side view) diagram and FIG. 1b illustrates a lateral cross section (i.e., end view) diagram of a conventional transmitter that includes an input waveguide 101, four identical amplifiers 110, four corresponding identical probes in the input waveguide coupled to the input terminals four amplifiers 110 via a corresponding coaxial cable 131 and symmetrically positioned from each probe in one plane that is disposed orthogonally to the direction of energy propagation 141, and four corresponding identical probes 122 in the output waveguide 102 coupled to the output terminals four amplifiers 110 via a corresponding coaxial cable 130 and symmetrically positioned from each other probe in one plane that is disposed orthogonally to the direction of energy propagation 142. In this example, the performance of the aggregate collection of amplifiers is optimized because each identical probe (and corresponding amplifier) is equally receiving power from the input wave, and equally contributing power to the output wave. This input and output equality is a result of the symmetrical positioning of the probes, as shown in FIG. 1. There are other examples of prior attempts with multi-probe based power combiners where equal power distribution among the probes is enforced by the symmetry of the structure However, if each amplifier does not equally saturate relative to other amplifiers (e.g., because each probe is not symmetrically positioned relative to other probe), inefficiencies, such as loss of power level, energy waste, etc. are present. As an example of some of these asymmetries, as shown in the side view diagram of FIG. 2, a conventional power combiner that includes four amplifiers 110; an input waveguide 101; an output waveguide 102; four corresponding identical input probes 121 in the input waveguide, with each probe is coupled to the input of its respective amplifier; and four corresponding identical output probes 122 in the output waveguide, with each probe is coupled to the output of its respective amplifier. In this example of FIG. 2, each set of these four conventional identical input 121 and output 122 probes are disposed in two planes i) orthogonal to the direction of energy propagation 141 142 (i.e., the direction of the "Output" or "Input" arrow or the longitudinal axis of the waveguide) within the waveguide and ii) parallel to the electric field 151 152 (i.e., "E" arrow). Moreover, as illustrated in FIG. 2, one set of two input probes are situated in a plane that is positioned one quarter wavelength of a wave signal from a back wall 161 of the input waveguide (i.e., the opposite end of the waveguide opening). The other set of two input probes are situated in a plane that is positioned one half wavelength of a wave signal from the first set of two input probes (i.e., three quarters wavelength of a wave signal from a back wall of the waveguide). The same is true of the two sets of two output probe 122s. As a result of this conventional configuration of FIG. 2, the power output from all four amplifiers 110 are combined in the waveguide along the direction of energy propagation.

However, because the two sets of two input probes 121 in FIG. 2 are disposed in a differently located planes orthogonal to the direction of energy propagation 141 within the input waveguide 101 (i.e., the probes are not symmetrically positioned to one another), the power being received from the input waveguide by each amplifier (and corresponding coupled input probe) is not equally driving each amplifier. In addition, the two sets of two output probes 122 in FIG. 2 are disposed in a differently located planes orthogonal to the direction of energy propagation 152 within the output waveguide 102 (i.e., the probes are not symmetrically positioned to one another), the power launched into the output waveguide 102 from each amplifier 110 (and corresponding coupled probe) is not equally contributing power to the overall combined output wave signal. These effects at the input side and the output side will mean that the amplifiers are not saturating at the same time, resulting in power inefficiencies. Because the input 121 and output 122 probes, as shown in FIG. 2, are of equal size, set at equal depth, constructed of the same material, etc. and only differ in being located at two different planes within the waveguide, neither the input amplitude coupling (i.e., energy transferred from the input waveguide to the input probe) among the four input probes 121 nor the output amplitude coupling (i.e., energy transferred from the output probe to the output waveguide) among the four output probes 122 are not sufficiently similar or are not equalized.

As another example that suffers from unequal power contribution among the input and output probes, FIGS. 3a-3c illustrate diagrams of another conventional transmitter that includes three identical input probes 121 symmetrically disposed in the input waveguide 101 in one plane orthogonal to the direction of energy propagation 141. Similarly, there are three identical output probes 122 symmetrically disposed in the output waveguide 102 in one plane orthogonal to the direction of energy propagation 142. Despite the fact that the three input probe launches 121 and three output probe launches 122 are symmetrically positioned, as illustrated in FIGS. 3b-3c, the electric field intensity 201 is not uniform over the cross section but sinusoidal in form (i.e., strongest intensity levels in the center of the input and output waveguide and tapering off to zero at the edges of the cross section of the input and output waveguide.) Because each input probe 121 in this three-way combiner is identical, as illustrated in FIG. 3b, the two flanking input probes excite the corresponding amplifier 110 differently than the central input probe as opposed to a more desired uniform distribution of power among the three amplifiers. Similarly, because each output probe in this three-way combiner is identical, as illustrated in FIG. 3c, the two flanking output probes couple to the output signal differently than the central output probe as opposed to a more desired uniform distribution of power among the three amplifiers 110.

SUMMARY

Embodiments of the invention include a multi-probe power combiner system for equalizing the amplitude balance of an input wave signal and an output wave signal. The system includes a plurality of power amplifiers. Each of the plurality of power amplifiers is capable of receiving an input signal, and transmits an amplified output signal. The system includes an input waveguide including a plurality of walls, an opening, and a direction of energy propagation away from the opening. An output waveguide includes a plurality of walls, an opening, and a direction of energy propagation toward from the opening. A plurality of input probes, each of the plurality of input probes i) is coupled to an input of a corresponding one of the plurality of power amplifiers, ii) extends into the input waveguide, and iii) includes at least one probe property that is different from at least one probe property of another one of the plurality of input probes. The system also includes a plurality of output probes, each of the plurality of output probes i) is coupled to an output of a corresponding one of the plurality of power amplifiers, ii) extends into the output waveguide, and iii) includes at least one probe property that is different from at least one probe property of another one of the plurality of output probes.

In one embodiment, a multi-probe power combiner system equalizes an amplitude balance of a signal. Each of a plurality of devices is capable of operating on a received input wave signal to create an output wave signal. An input waveguide includes a plurality of walls, an opening, and a direction of energy propagation away from the opening. An output waveguide includes a plurality of walls, an opening, and a direction of energy propagation toward the opening. A plurality of input waveguide probes is disposed in the input waveguide. A plurality of output waveguide probes is disposed in the output waveguide. The plurality of input waveguide probes is coupled to the plurality of output waveguide probes via the plurality of devices. At least one of the plurality of output waveguide probes comprises at least one probe property thereof that is different from at least another probe property of the plurality of output waveguide probes.

According to another embodiment, a multi-probe power combiner system equalizes an amplitude balance of a signal. A first waveguide defines a direction of energy propagation toward an opening thereof. A second waveguide defines another direction of energy propagation toward another opening thereof. A first set of a plurality of waveguide probes disposed in the first waveguide coupled to a second set of plurality of waveguide probes disposed in the second waveguide via a plurality of devices for receiving the signal. One of the first set of the plurality of waveguide probes is positioned in the waveguide as a function of at least another probe property of the first set of the plurality of waveguide probes.

According to a further embodiment, a multi-probe power combiner apparatus equalizes an amplitude balance of a signal. An input waveguide defines a first direction of energy propagation toward an input opening thereof. An output waveguide defines a second direction of energy propagation toward an output opening thereof. A plurality of input waveguide probes is disposed in the input waveguide. Each of the plurality of input waveguide probes includes at least one probe property. A plurality of output waveguide probes is disposed in the output waveguide. Each of the plurality of output waveguide probes includes at least one probe property, wherein the plurality of output waveguide probes is positioned in the output waveguide as a function of having the at least one probe property of the plurality of output waveguide probes being different from one another.

BRIEF DESCRIPTIONS OF THE DRAWINGS

Figure 4A:
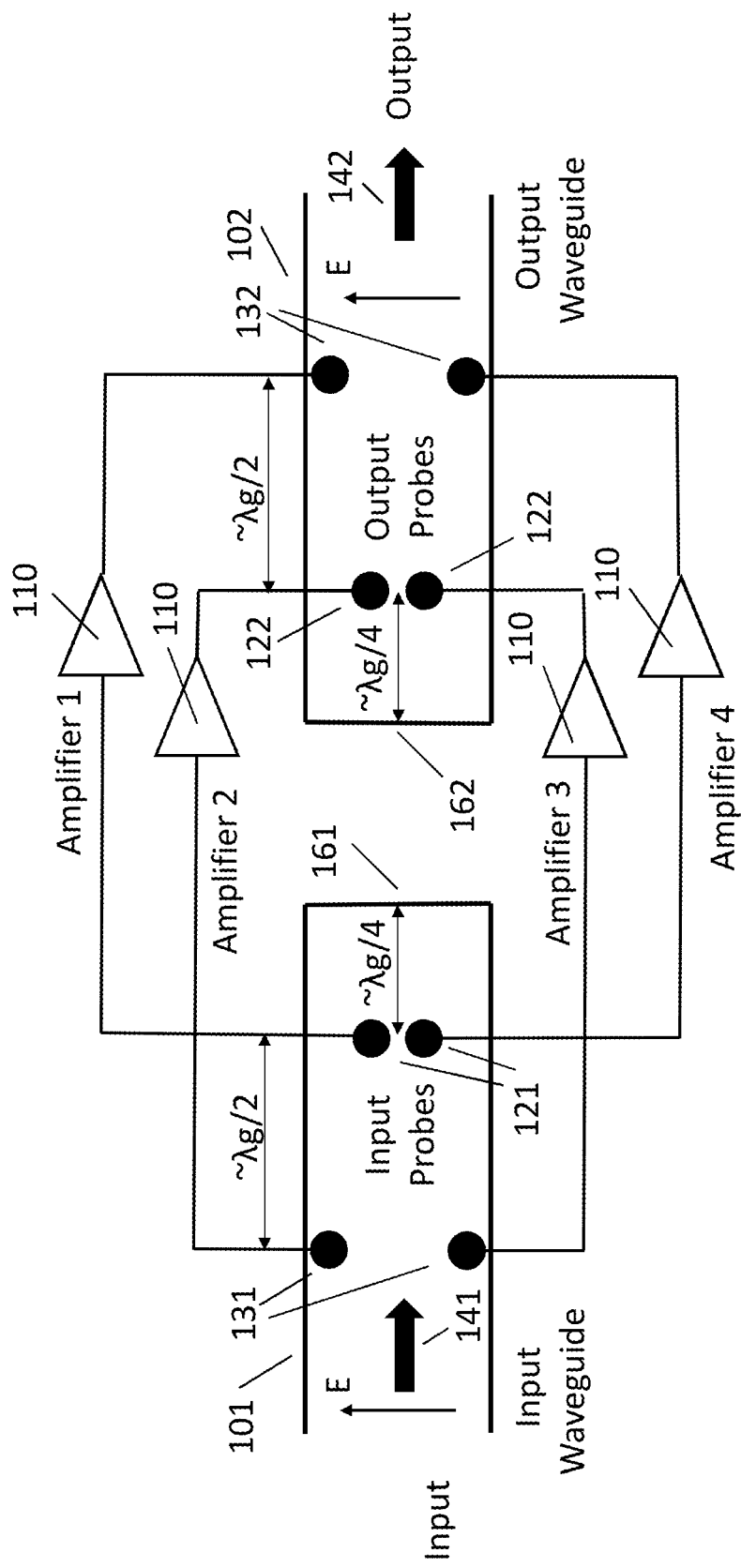

FIG. 4a illustrates a side view diagram of an exemplary probe launch power combiner that includes two sets of two input probe launches i) in two different planes orthogonal to the direction of energy propagation and ii) of two different depths into the input waveguide; and two sets of two output probe launches i) in two different planes orthogonal to the direction of energy propagation and ii) of two different depths into the output waveguide according to one embodiment of the invention.

Figure 4B:
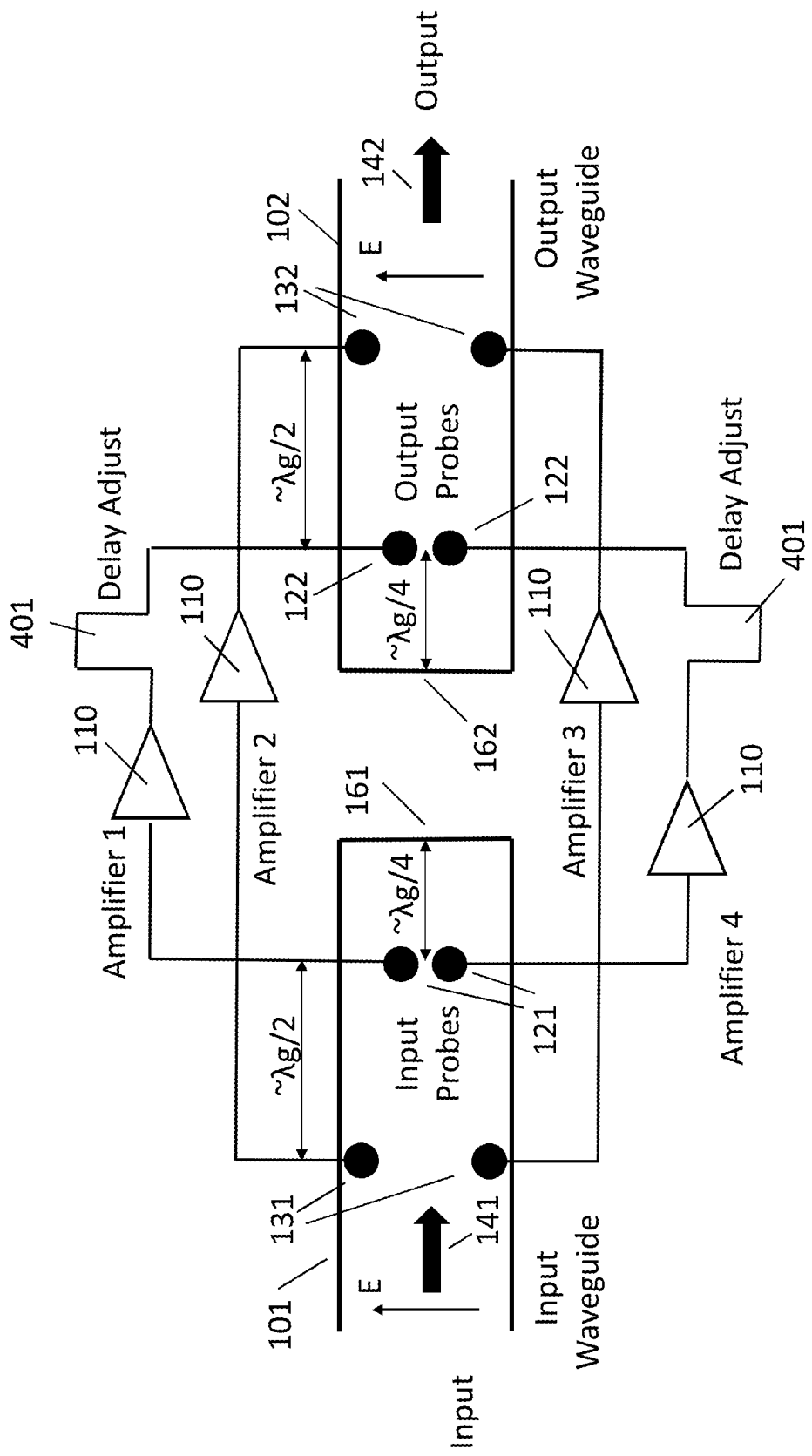

FIG. 4b shows a slightly different embodiment of FIG. 4(a) wherein the amplifiers are connected to different sets of input and output probes. If needed, a delay adjusting element can be used to equalize the phase or time delay according to one embodiment of the invention.

Figure 4C:
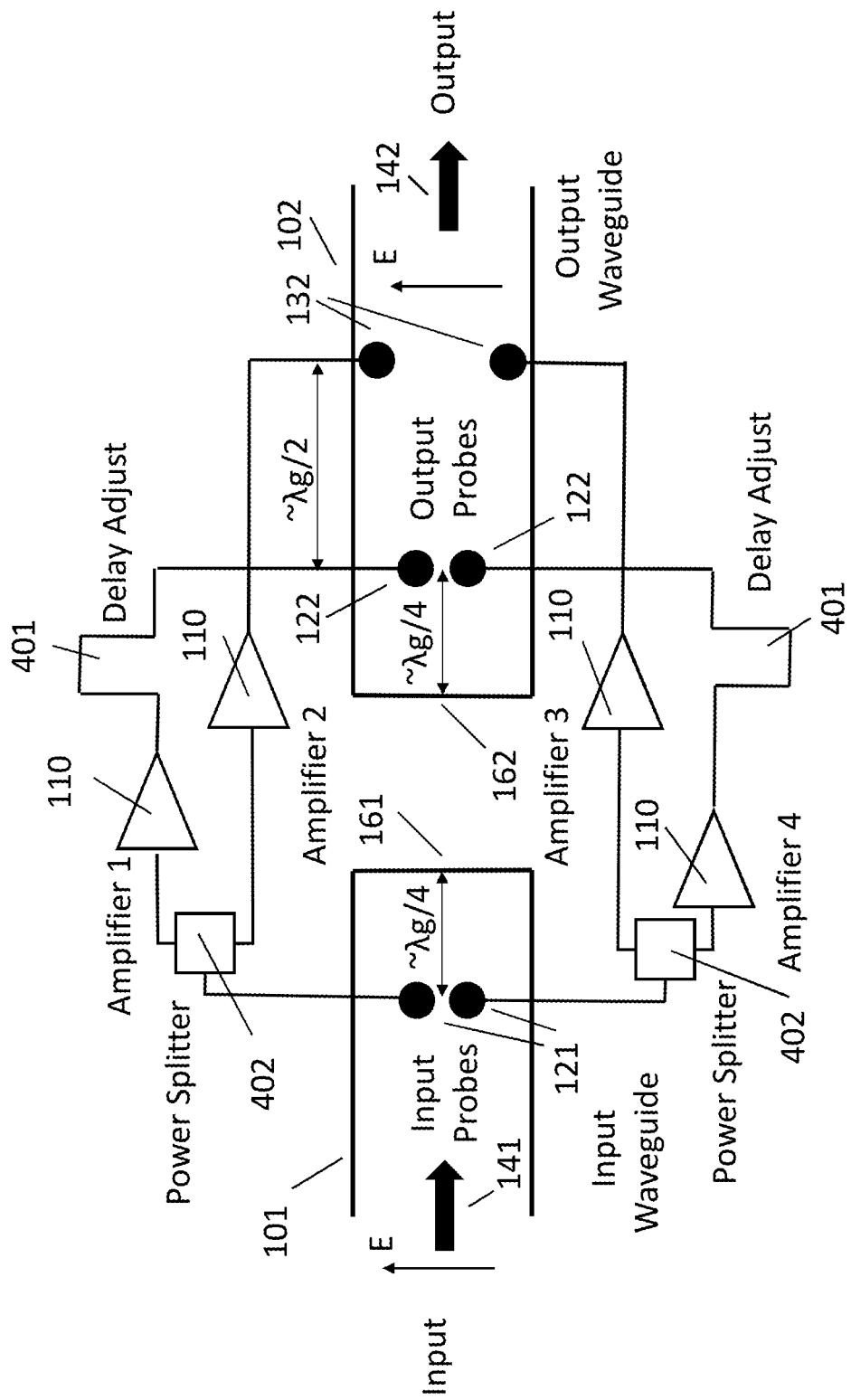

FIG. 4c illustrates a multi-probe combiner where there is not a 1:1 correspondence between the input probes and the output probes. In this example, there are only two input probes while there are four output probes. The signals from the two input probes are split using power splitters, with the signal from each input probe driving two amplifiers. The outputs of the four amplifiers are coupled to the four output probes arranged in two sets of two, wherein the two sets of two output probe launches are i) in two different planes orthogonal to the direction of energy propagation and ii) of two different depths into the output waveguide according to one embodiment of the invention.

Figure 5A:
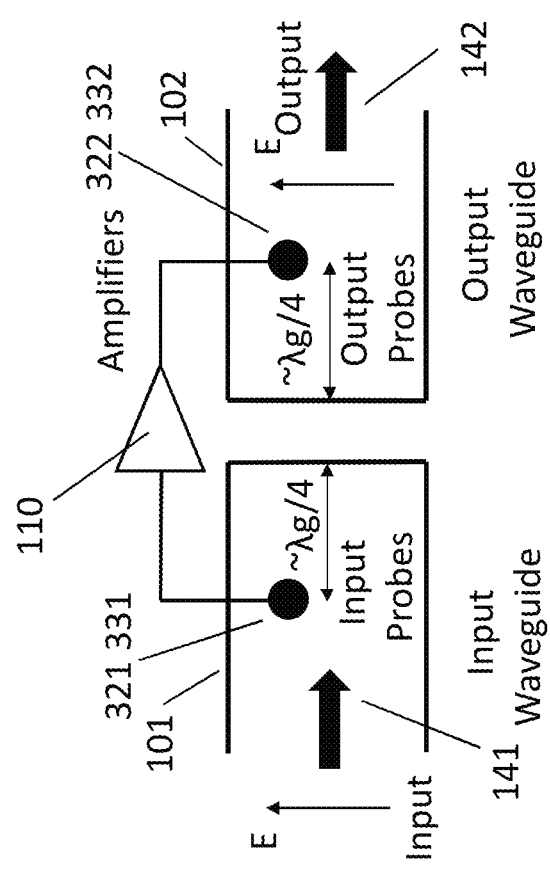
Figure 5C:
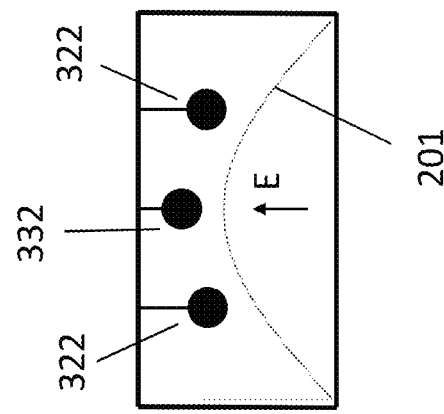
Figure 5B:
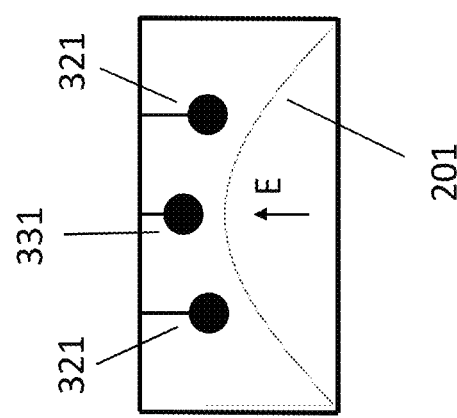

FIGS. 5a-5c depict another embodiment of the invention. FIG. 5a illustrates an side view diagram and FIGS. 5b-5c illustrate end-view diagrams showing an exemplary probe launch power combiner that includes three input probe launches i) in the same plane orthogonal to the direction of energy propagation and ii) of various depths into the input waveguide; and three output probe launches i) in the same plane orthogonal to the direction of energy propagation and ii) of various depths into the output waveguide according to one embodiment of the invention.

Figure 6:
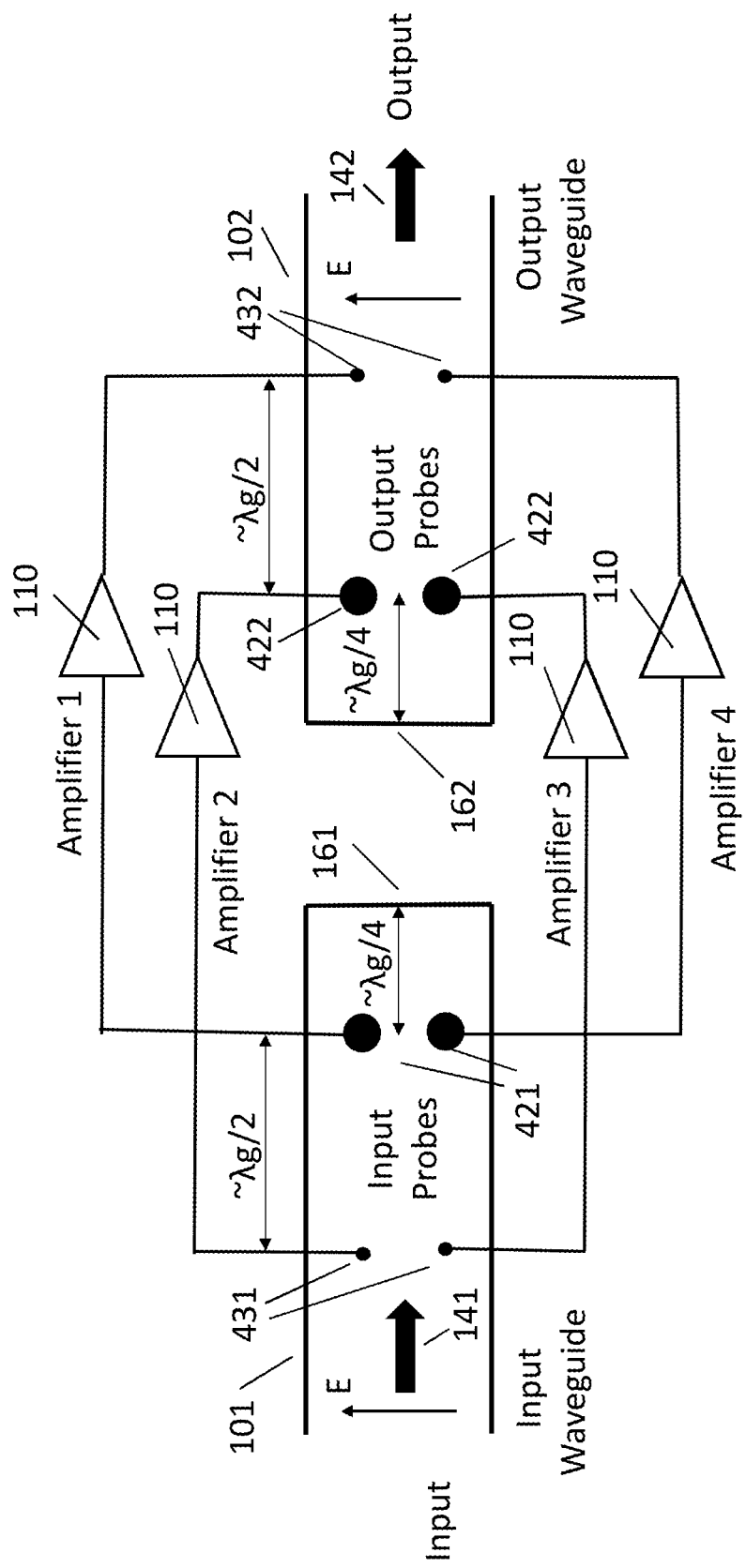

FIG. 6 illustrates a side view diagram of an exemplary probe launch power combiner that includes two sets of two input probe launches i) in two different planes orthogonal to the direction of energy propagation and ii) of two different sizes; and two sets of two output probe launches i) in two different planes orthogonal to the direction of energy propagation and ii) of two different sizes according to one embodiment of the invention.

Figure 7A:
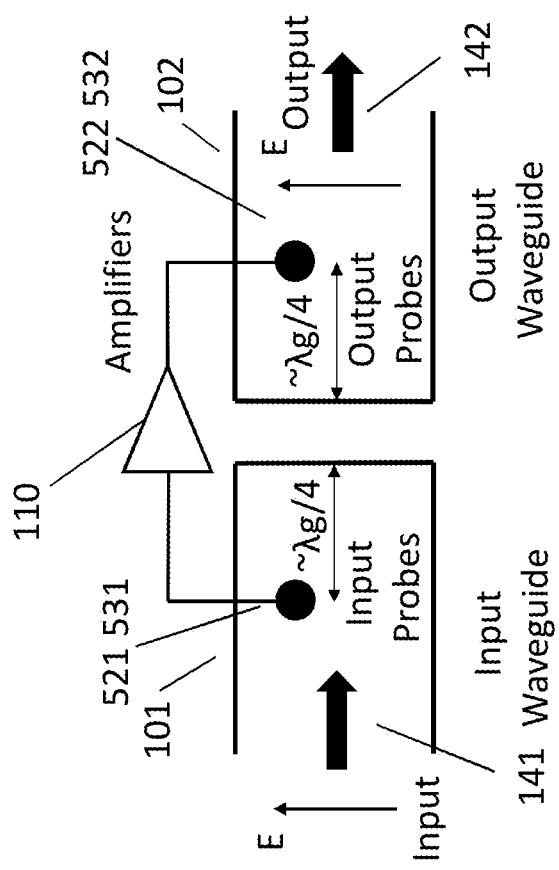
Figure 7C:
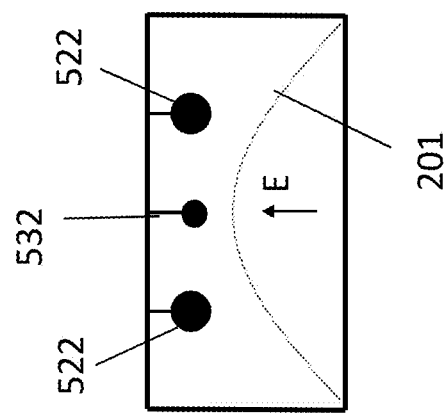
Figure 7B:
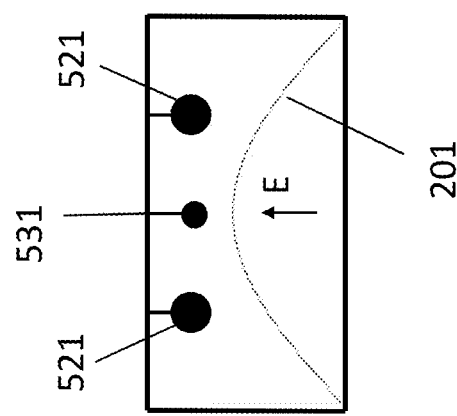

FIG. 7a illustrates a side view diagram and FIGS. 7b-7c illustrate end-view diagrams based on an exemplary probe launch power combiner that includes three input probe launches i) in the same plane orthogonal to the direction of energy propagation and ii) of various sizes; and three output probe launches i) in the same plane orthogonal to the direction of energy propagation and ii) of various sizes according to one embodiment of the invention.

Figure 8:
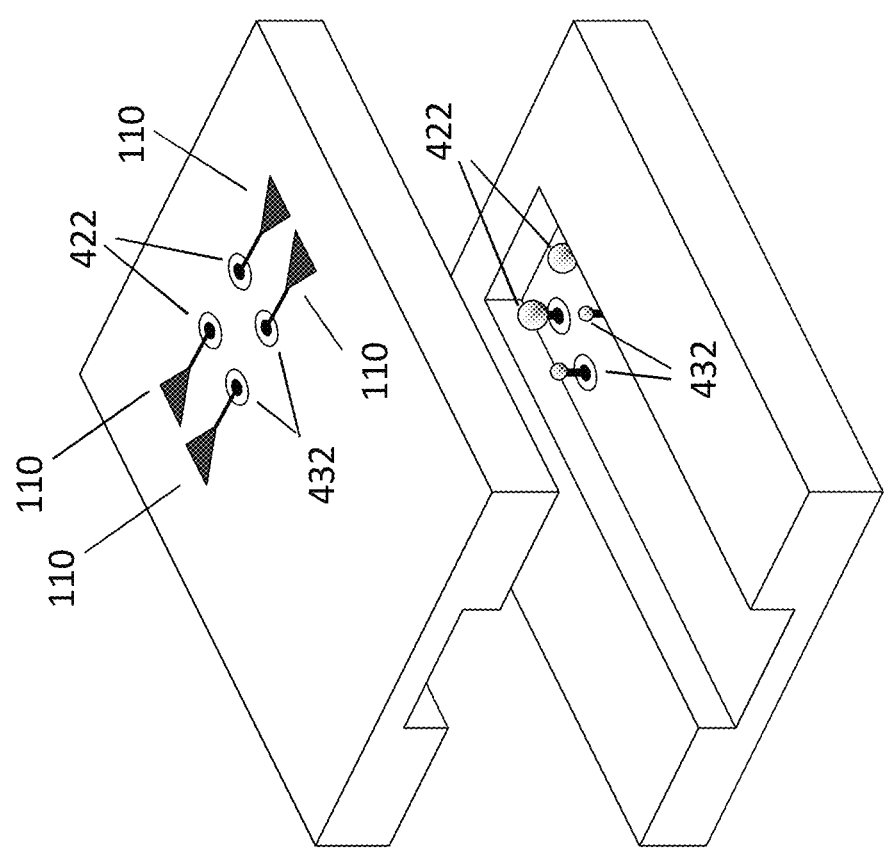

FIG. 8 depicts a three dimensional view of an exemplary probe launch power combiner that includes two sets of two output probe launches i) in two different planes orthogonal to the direction of energy propagation and ii) of various depths into the output waveguide according to one embodiment of the invention. The input waveguide and the input probe launches are omitted for clarity.

Figure 9:
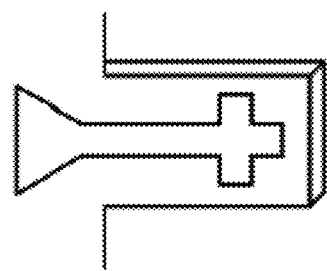

FIG. 9 depicts an exemplary probe launch that includes a metal trace formed into a particular shape on a dielectric substrate according to one embodiment of the invention.

Figure 10:
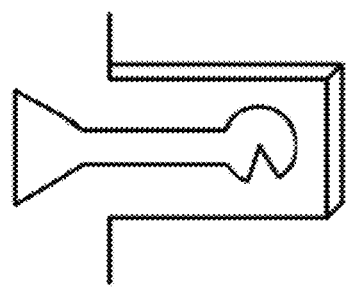

FIG. 10 depicts an exemplary probe launch that includes a metal trace formed into a particular shape on a dielectric substrate according to one embodiment of the invention.

Figure 11:
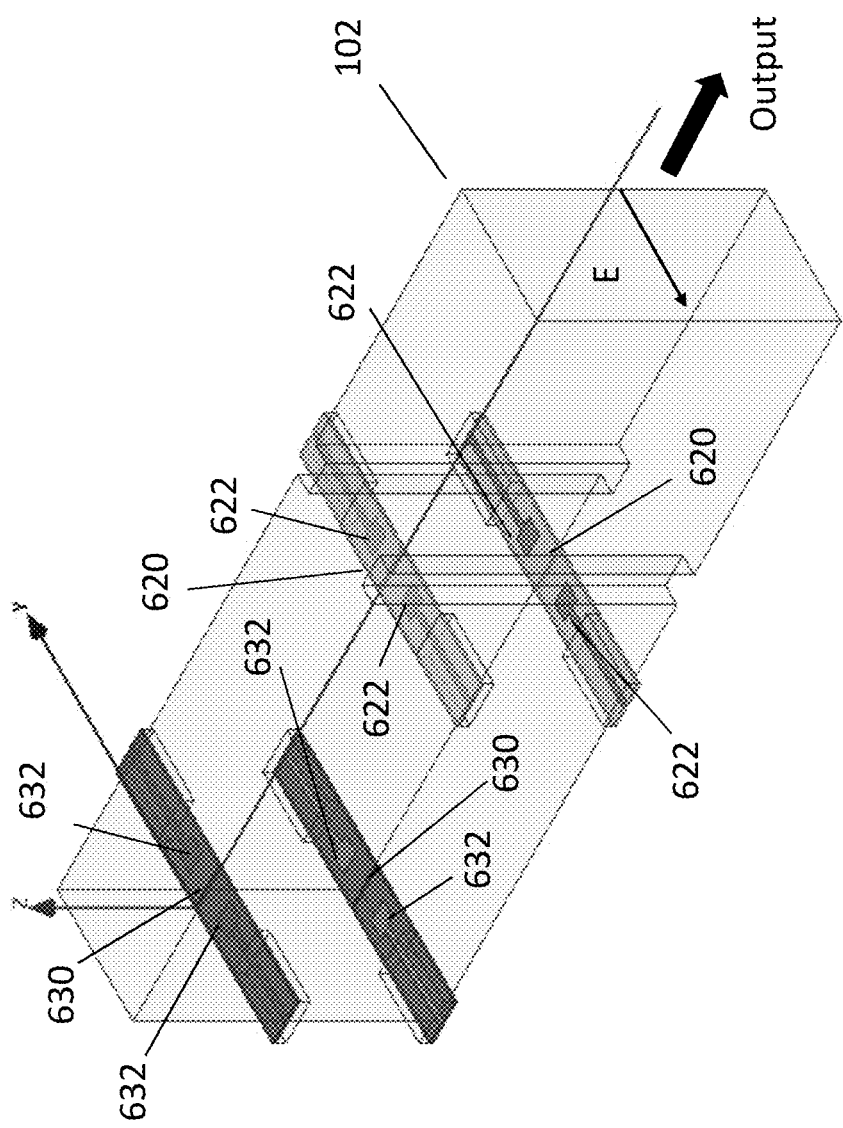
Figure 12:
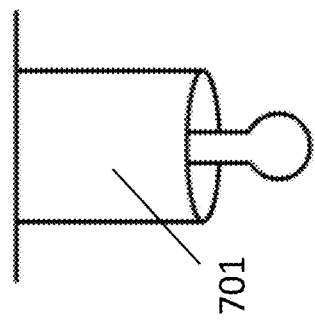

FIG. 11 depicts a three dimensional view of an exemplary probe launch power combiner that includes two sets of two output probe launches i) in two different planes orthogonal to the direction of energy propagation and ii) of different dielectric constant substrates according to one embodiment of the invention. The input waveguide and the input probe launches are omitted for clarity FIG. 12 depicts an exemplary probe launch that includes an insulating sheath according to one embodiment of the invention.

Figure 13:
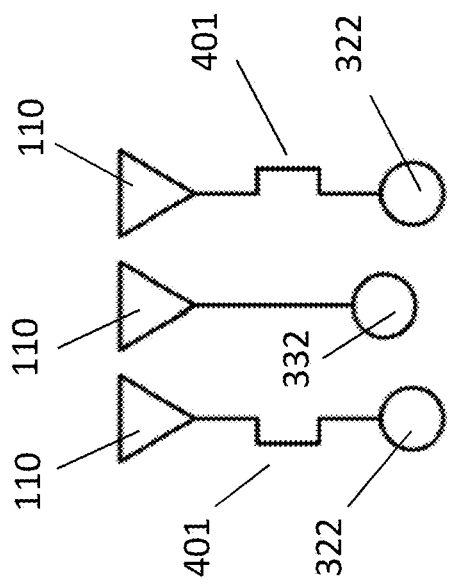

FIG. 13 illustrates a power amplifier and output probe launch diagram for controlling phase shifts and/or time delays for amplified power signals provided to the probe launches. The input probe launches are omitted for clarity according to one embodiment of the invention.

Figure 14:
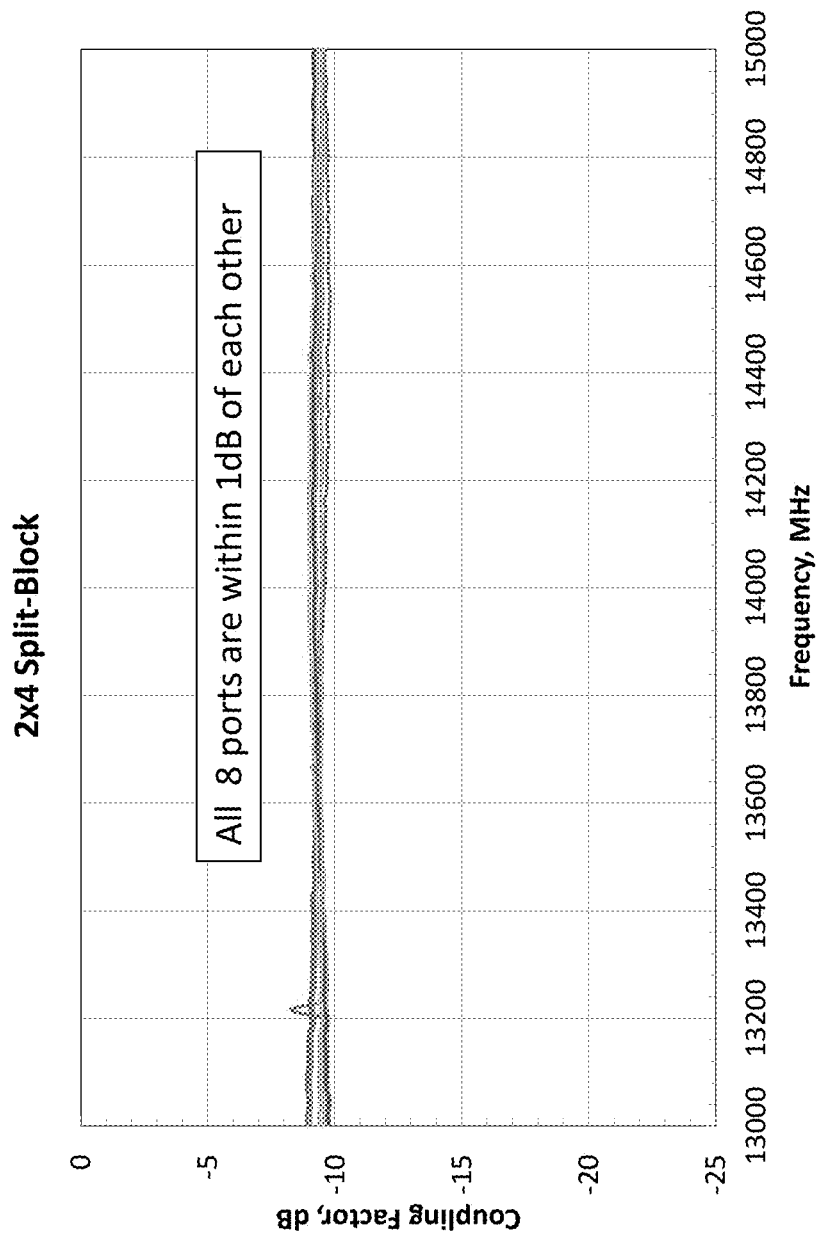

FIG. 14 depicts a test results graph for the performance for eight probe launches using the techniques according to one embodiment of the invention.

Corresponding reference characters indicate corresponding parts throughout the drawings.

DETAILED DESCRIPTION

Generally speaking, a probe-launch waveguide power combiner system will perform optimally by equalizing the coupling (i.e., energy transfer) amplitude and phase of each probe among each of the other probes via altering properties associated with a particular probe. This is true for both the input probes as well as the output probes. In other words, the probe-launch waveguide power combiner system allows properties of a particular input or output probe to be altered, such as the probe's location, size, material properties, a shape of the metal traces printed on the circuit board material, a sheath of at least one of a conducting or an insulating material that surrounding a particular waveguide probe, a dielectric constant circuit board material, a thickness of the circuit board material, etc., so that the coupling amplitude and phase of the particular probe is sufficiently similar to the coupling amplitude and phase of each other probe in the waveguide. As a result, after the appropriate one or more properties of each probe have been determined based on the wavelength of the wave signal and any other factors, the waveguide power combiner may be optimized.

As described above, in one example, one of the probe properties that affects the coupling amplitude of a combined wave signal may include a depth of how far the probe extends into the waveguide. Typically, altering the depth of a probe so that the probe extends farther into the waveguide generates a stronger coupling response for that particular probe. On the other hand, altering the depth of the probe to retract the probe generates a weaker coupling amplitude for the wave signal. Changing the depth of one or more individual probes may assist to generate a sufficiently similar amplitude balance among all the amplitudes of each probe, particularly in situations where the symmetry of the structure does not force equal coupling amplitudes among the input and output probes.

For example, as shown in FIG. 4a, a probe-launch power combiner may include a total of four input waveguide probes 121 and 131, or a first set, that are located in two sets of two input waveguide probes. The combiner also may include a total of four output waveguide probes 122 and 132 that are located in two sets of two output waveguide probes. Furthermore, as illustrated in FIG. 4a, these two sets of input waveguide probes may be positioned in two different planes that are orthogonal to the direction of energy propagation 141. One plane, containing two input probes 121, may be positioned closer to the closed end wall of the waveguide 161. In this example, the two input probes 121 may be positioned about or approximately one quarter of a wavelength of the wave signal from the closed end wall. On the other hand, the other two input probes 131 on the other plane may be positioned closer to the waveguide opening. For example, these probes 131 may be located about or approximately one half of a wavelength toward the direction of energy propagation from the other plane). Similarly, the two sets of output waveguide probes 122 and 132 may also be positioned in two different planes that are orthogonal to the direction of energy propagation 142. As such, it is to be understood that the probes 121 and 131 may be positioned in the waveguide at a distance from one of the walls of the waveguide as a function of a strength of wave signal, coupling effects, field strength, or a combination thereof.

Figure 1A:
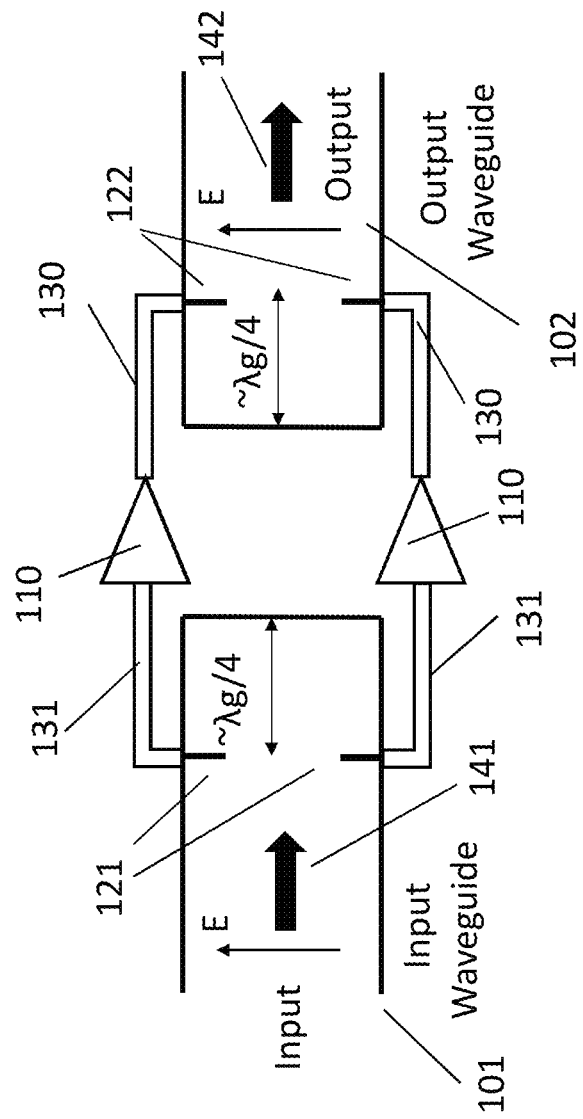
FIGS. 1a-1b depict two different views of a prior art probe launch power combiner that includes four input probe launches in the same plane orthogonal to the direction of energy propagation and four output probe launches in the same plane orthogonal to the direction of energy propagation.
Figure 1B:
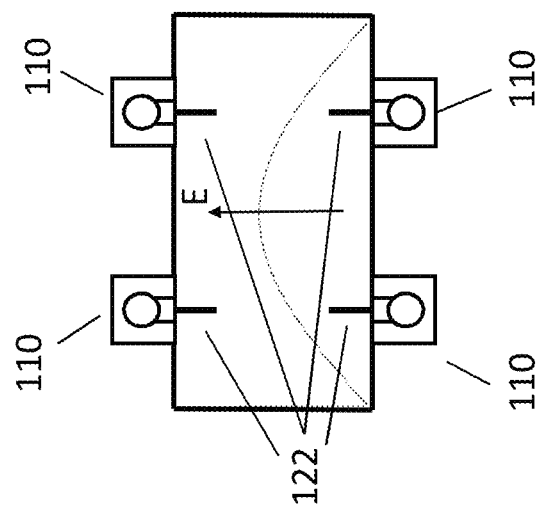
Figure 2:
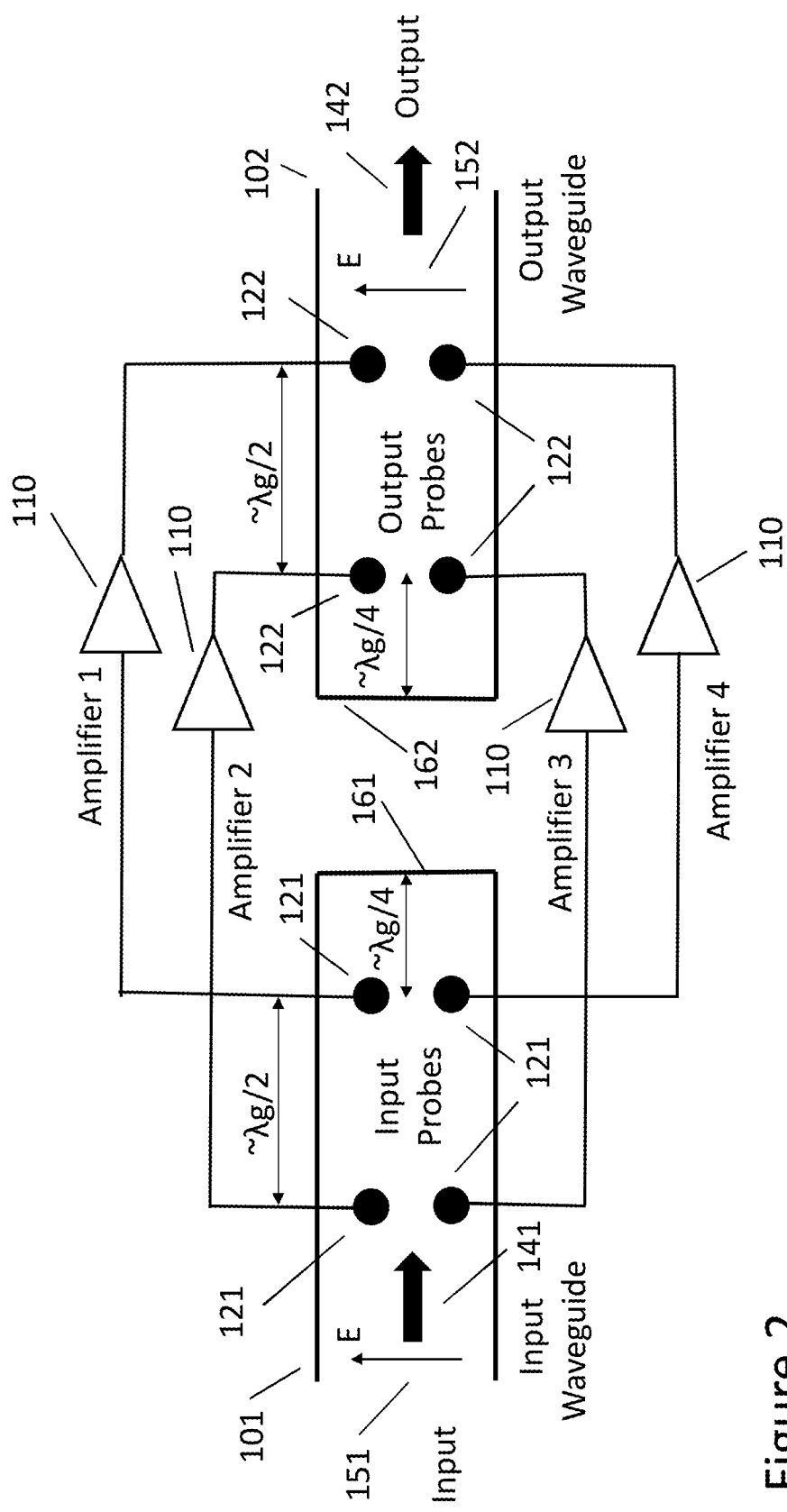
FIG. 2 illustrates a side view diagram of another prior art probe launch power combiner that includes two sets of two input probe launches in two different planes orthogonal to the direction of energy propagation and two sets of two output probe launches in two different planes orthogonal to the direction of energy propagation.

As discussed above in reference to FIG. 2, probes located further back in a waveguide (i.e., closer to the closed end) 121 and 122 may not have as strong coupling effect as probes located closer to the waveguide opening 131 and 132 because a wave propagated from one of the probes located further back in the waveguide has further to travel in distance to reach the waveguide opening, and the field strengths may be altered by the presence of the set of probes located closer to the waveguide openings. However, according to aspects of the invention, this difference in coupling effect between the two sets of input or output probes may be mitigated by changing the properties of the probes located further back in the waveguide or of the probes located closer to the opening. Thus, as an example shown in FIG. 4a, one of these probe property changes may include altering the depth of the input or output probe's extension into the corresponding input or output waveguide.

Still referring to FIG. 4a, for the rest of this discussion, the disclosure will concentrate on the output probes 122 and 132, or as a second set, in the output waveguide 102, recognizing that an identical argument may be applied to the input probes 121 and 131 in the input waveguide 101. As the example in FIG. 4a illustrates, the two output probes 132 located closer to the output waveguide opening may be positioned in the output waveguide in such a way that only those two output probes 132 closer to the output waveguide opening do not extend as far into the output waveguide as the two output probes 122 located further in the back of the output waveguide. As a result, the value of the coupling amplitude of the two output probes 132 closer to the output waveguide opening may be sufficiently equalized to substantially the same in value with coupling amplitude of the two output probes 131 located further back in the output waveguide. As mentioned earlier, essentially identical techniques can be used to equalize the input-side coupling of the input probes 121 and 131 in the input waveguide 101.

Embodiments of the invention further identify other ways to connect the amplifiers to the sets of input and output probes. For example, according to an alternative embodiment, FIG. 4b illustrates a different configuration of how the input probes 121 and 131 and the output probes 122 are 132 are connected to the corresponding amplifier's 110 input and output terminals in a manner different from FIG. 4a. In this case, it may be necessary to include a phase or time delay adjusting network 401 to equalize the time or phase delays and optimize the performance of the power combiner. The delay adjusting networks may be used in the original embodiment shown in FIG. 4a to optimize the performance.

It is also important to stress that it is not strictly necessary to have a 1:1 correspondence between the input probes and the output probes. A designer may wish to use other means to distribute the energy to and from the amplifiers, and need not be constrained to have an equal number of input and output probes. For example, FIG. 4c shows a system that combines the output of four amplifiers 110 using four output probes 122 and 132 arranged in two sets of two probes in the output waveguide 102. The input waveguide 101, however, only has a total of two input probes 121. In this example, each input probe 121 feeds a 2:1 power splitter 402, which may be a Wilkinson-style microstrip divider, a microwave hybrid coupler, or even a simple tee junction. In this example, the depths of only the output probes 122 132 are varied to achieve an amplitude balance, while symmetry dictates that the two input probes 121 have an equal amplitude balance. This approach may require a phase or time delay network 401 to equalize the phase. Other techniques taught herein to equalize the amplitude of the output coupling (e.g. varying the size of the probe reactant, etc.) could also be used. This Figure is only one example: using other types of power splitters (e.g. 3:1 or 4:1) could enable essentially arbitrary ratios of output probes to input probes.

Figure 3A:
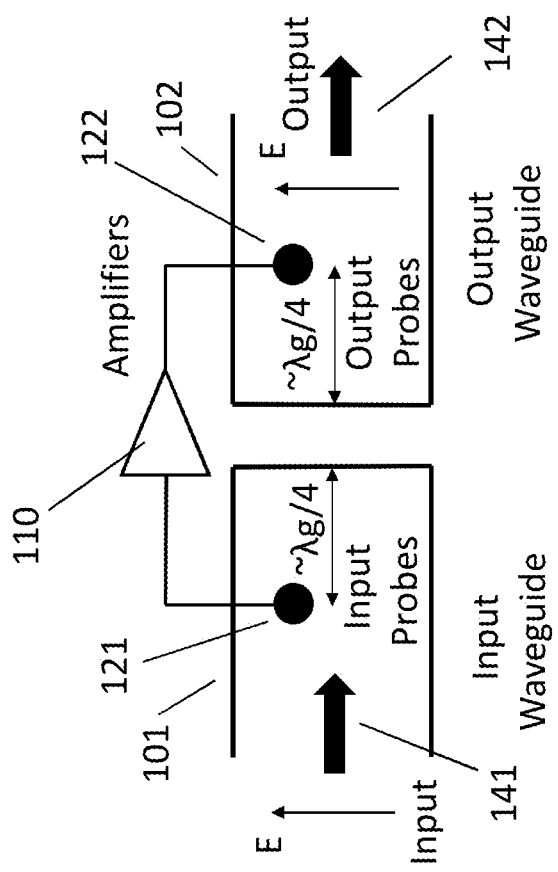
FIGS. 3a-3c illustrate diagrams of another prior art probe launch power combiner that includes three input probe launches in the same plane orthogonal to the direction of energy propagation and three output probe launches in the same plane orthogonal to the direction of energy propagation.
Figure 3C:
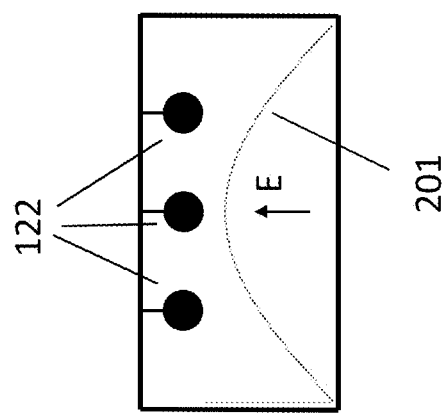
Figure 3B:
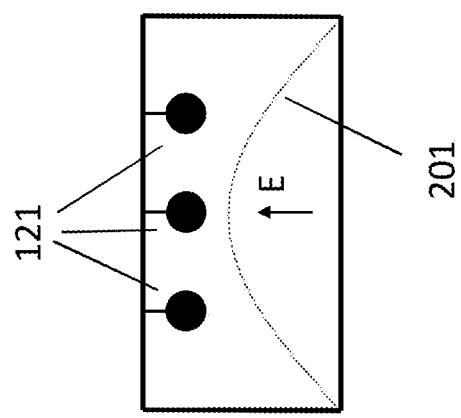

Similarly, as discussed above in FIG. 3, depending on the positioning of probes placed into the waveguide, the amplitude coupling may not be substantially equal among the three probes despite the fact that the probes are symmetrically positioned in the waveguide because the electric field intensity 201 varies in the cross-section of the waveguide. Again, it is to be understood that the analysis for the input-side and the output-side waveguides and probes are essentially identical, and it is necessary to explain only one. As the disclosed techniques herewithin teach, another example illustrates in FIGS. 5a, 5b, and 5c that changing the depth of the center probe 331 and 332 relative to the two flanking probes 321 and 322 may diminish or may eliminate the disparity in coupling amplitude among the three probes. As shown in FIG. 5, the depth of the center probe 331 332 is retracted, and as result, the coupling effect is weakened which brings the coupling amplitude of the center probe 331 332 more in line with the coupling amplitude of the two flanking probes 321 322 and equalizes the balance of coupling amplitudes among all three probes.

Another probe property that affects coupling effect may include the size of a probe or the size of a probe reactant (e.g., a spherical cap of a particular diameter positioned at the end of the probe or any other suitable shape or object positioned at the end or along the probe of a particular size). Generally, a larger probe (in terms of volume) reactant generates a stronger coupling effect, and conversely, a smaller probe reactant produces a weaker coupling effect. Similarly as described above regarding the depth of a probe, this probe property of probe reactant size may be utilized in a power combiner to assist in equalizing the balance of each probe's coupling amplitude. Again, it is to be emphasized that this analysis applies to both the input probes as well as the output probes. For example, as shown in FIG. 6, the two input probes 431 situated closer to the input waveguide opening may include probe reactants that are smaller in volume size than the probe reactants of the two input probes 421 located further back in the input waveguide near the end wall 161. Also, the two output probes 432 situated closer to the output waveguide opening may include probe reactants that are smaller in size than the probe reactants of the two input probes 422 located further back in the output waveguide near the end wall 162.

Despite the fact that the depths of each of the four input probes 421 and 431 are equal, as are the depths of the four output probes 422 and 432, the smaller probe reactants of the probes 431 and 432 located closer to the waveguide opening assist in weakening the coupling effect compared to the coupling to the probes 421 and 422 located father from the waveguide opening. As a result, the overall power combiner may better equalize the balance among all four probes so that the coupling amplitudes of all four probes are substantially similar. It is also to be noted that, as shown in FIG. 4b, different sets of input and output probes may be connected to the four amplifiers in a different manner, and delay equalization networks may be used to further improve performance. Also, as shown in FIG. 4c, there need not be a 1:1 correspondence between the input and output probes.

As another example, as shown in FIGS. 7a, 7b, and 7c, a smaller probe reactant of a center probe 531 and 532 may be implemented to lessen the coupling effect of the center probe relative to that of the two flanking probes 521 522 in FIGS. 7b and 7c. Because the size of probe reactants of the other two probes 521 and 522 flanking the center probe 531 and 532 remain larger than the reactant of the center probe 531 and 532, the coupling balance is better equalized among the three probes in that the coupling amplitudes are substantially similar in value. Again, this analysis applies to both input probes and output probes.

Although FIGS. 4-7 depict a number of similar examples, it is to be understood that the probe-launch waveguide power combiner system may include any number of input and output probes found in any number of configurations without departing from the scope or spirit of embodiments of the invention. These configurations may include any number of input and output probes found in a single plane orthogonal to the direction of energy propagation (i.e., the direction toward the input or output waveguide opening), any number of planes orthogonal to the direction of energy propagation, each individual probe may be positioned at any suitable depth into waveguide, or any combinations of these probe configurations. For example, one embodiment may include a power combiner that includes input and output waveguides with eight input and output probes positioned in one plane orthogonal to the direction of energy propagation in which four output probes are positioned at one depth into the waveguide and the other four output probes are positioned at a different depth, with the input probes following a similar disposition. Moreover, in continuing this example, each input or output probe may include a probe reactant that is of a different size from at least one other input or output probe reactant of a different input or output probe within the plane or within the same power combiner. Furthermore, power combiner configurations may also include two or more planes orthogonal to the direction of energy propagation in which one or more plane has a configuration of probes (e.g., depth of probe, size of reactant of probe, material of probe, etc.) different from the one or more of the other planes within the power combiner.

For example, as shown in FIG. 8, three-dimensional depiction of the output side of a power combiner including an output waveguide and eight power amplifiers or devices 110 coupled to a corresponding eight output probes 422 and 432 via metal trace lines. The input-side components (input waveguide and eight input probes) are omitted in this figure for clarity. In this example, the four output probes 422 positioned in a plane orthogonal to the direction of energy propagation and further back in the output waveguide may include one or more probe properties that are different from the four output probes 432 positioned in a plane orthogonal to the direction of energy propagation and closer to the output waveguide opening. To equalize the coupling amplitude in all eight output probes, one or more of the output probes 422 positioned further back in the output waveguide may include a larger diameter probe reactant than the probe reactants of the output probes 432 positioned closer to the output waveguide opening.

Furthermore, in addition or alternative to using different sized probe reactants, each one or more of the output probes 422 positioned further back in the output waveguide may be positioned to extend deeper into the output waveguide than the depth extension of the output probes 432 positioned closer to the input waveguide opening. Again, an identical analysis can be performed for the input probes in the input waveguide.

Another technique to equalize coupling amplitude may include the use of an input or output probe that includes a printed metal trace on circuit board material or any other non-conductive substrate. These board probes may include printed metal traces that may be designed to be printed in any shape, any thickness (of the metal trace), any length or any other attributes suitable for implementing a board probe, and can be used as both input and output probes. As an example, the board probe depicted in FIG. 9 may be a cross that includes a metal trace of any thickness, a main leg of the cross of any width and/or three minor legs if any width. Looking toward another example that is shown in FIG. 10, a board probe may also include a printed metal trace that includes "pac-man" shape (i.e., a circle at the bottom with a wedge removed from the circle).

The non-conductive substrate board may be of any dielectric constant, any thickness, any length, any width, etc. Generally, the board probes described above and the examples shown in FIGS. 9 and 10 are positioned orthogonally to the direction of propagation, but the board probes may be positioned in parallel with the direction of propagation as well.

For example, as shown in FIG. 11, board probes may additionally include two metal trace probes 622 printed on one substrate 620. As a result, the substrate may be positioned to span the entire width of the waveguide and be positioned in parallel with the direction of propagation. As shown in FIG. 11, the board probes 632 positioned further back in the waveguide may be printed on a substrate 630 with a dielectric constant that is different from the dielectric constant of a substrate 620 upon which are printed probes 622 positioned closer to the waveguide opening to help equalize the coupling amplitude among all the probes. FIG. 11 only depicts the output side of the combiner. The input side is omitted for clarity.

An additional technique to equalize coupling amplitudes among multiple input or output probes includes the use of a probe sheath. As shown in FIG. 12, the probe 701 sheath may include any type of material (e.g., non-conductive, conductive, etc.), may be of any length or thickness, may be covered in or coated with any type of material, etc. The probe sheath may be coupled to the walls of the waveguide without physically contacting a center column of the probe. In some alternative embodiments, may include a dielectric material, for example, that is structurally attached to the center column probe.

As previously mentioned, equalizing the phase shift or time delay, in addition to the amplitude, among each probe in a power combiner also helps to better the performance of an output wave signal. For example, a probe-launch waveguide power combiner may additionally include a phase shifter that positioned between a power amplifier or device and a probe and is capable of shifting the phase of an amplified signal from the amplifier. A phase shifter may include a component or may be implemented via utilizing a delay line (i.e., between a power amplifier and a probe) for specific probe that is longer than another delay line for another probe.

For example, as shown in FIG. 13, three power amplifiers 110 corresponding to three output probes 322 and 332 (e.g., the three output probes of FIGS. 5b-5c in which the center output probe 332 does not extend as far into the waveguide as the two outer probes 322 to assist in equalizing the coupling amplitude among the three output probes) may be connected via three corresponding lines. Because the center output probe 332 does not extend as far into the waveguide in this example, the coupling phase of the center output probe is out of sync or is of a different phase compared to the other two flanking output probes 322, and some phase equalization may be needed. Continuing this example, the configuration of the lines 401, as shown in FIG. 13, shifts the coupling phase of the two flanking probes to be in line with the phase of the center probe. Again, note that the input-side probes are not shown in FIG. 13 for clarity. The phase equalization networks 401 may be placed at the input of the amplifiers as well.

As shown in FIG. 14, a graph depicting the coupling amplitude performance for each probe in a probe-launch waveguide power combiner that includes two sets of four probes is depicted for a particular experiment. As a result, the graph illustrates that the amplitude coupling for each probe is substantially similar in that less than 1 dB separates the eight probes (across the band 13 to 15 GHz) tested in the experiment. Moreover, the power combiner tested revealed that the power combiner is well matched by achieving less than −20 dB reflections from the waveguide port, and exhibiting power insertion losses of approximately 0.3 dB.

According to a further embodiment of the invention, a method equalizes an amplitude balance of a signal. The method includes defining a direction of energy propagation of the signal through a waveguide. The method further includes connecting a first set of a plurality of waveguide probes to a second set of the plurality of waveguide probes via a plurality of devices. The plurality of the devices is energized such that the first set of the plurality of waveguide probes receives the signal for the second set of the plurality of waveguide probes to propagate the signal. Each of the first set of the plurality of waveguide probes includes at least one probe property, and the at least one probe property is different from the at least one probe property of the second set. The method further includes positioning or adjusting positions of the first set and/or the second set as a function of the at least one probe property to achieve the amplitude balance of the signal.

Any of the techniques could be used alone or in combination, and it is not necessary to use the same techniques for both the input probes and the output probes. For example, a designer may choose to equalize the input amplitude balance by varying the size of the input probe reactants, while equalizing the output amplitude balance by varying the depth that the output probes penetrate into the output waveguide as well as the size of the output probe reactants.

Still further, the figures depict preferred embodiments of a probe-launch power combiner system for purposes of illustration only. One skilled in the art will readily recognize from the foregoing discussion that alternative embodiments of the structures and methods illustrated herein may be employed without departing from the principles described herein. Thus, upon reading this disclosure, those of skill in the art will appreciate still additional alternative structural and functional designs for a multi-probe power combiner system and a process for equalizing the amplitude balance of an output wave signal through the disclosed principles herein.

Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A multi-probe power combiner system for equalizing an amplitude balance of a signal, the system comprising:
 a plurality of devices for operating on a received input wave signal to create an output wave signal;
 an input waveguide including a plurality of first walls, a first opening, and a first direction of energy propagation away from the first opening;
 an output waveguide including a plurality of second walls, a second opening, and a second direction of energy propagation toward the second opening;
 a plurality of input waveguide probes disposed in the input waveguide; and
 a plurality of output waveguide probes disposed in the output waveguide, wherein (i) the plurality of input waveguide probes is coupled to the plurality of output waveguide probes via the plurality of devices, (ii) at least one of the plurality of output waveguide probes comprises at least one probe property thereof that is different from at least another probe property of the plurality of output waveguide probes, (iii) the plurality of output waveguide probes are disposed in positions of the output waveguide so that a coupling amplitude and phase of one of the plurality of the output waveguide probes is sufficiently similar to a coupling amplitude and phase of each other of the plurality of output waveguide probes in the output waveguide.

2. The system of claim 1, wherein at least one of the plurality of output waveguide probes extends into the output waveguide orthogonally.

3. The system of claim 1, wherein the plurality of input waveguide probes is positioned, at a distance from one of the plurality of first walls, as a function of a strength of the input wave signal.

4. The system of claim 3, wherein the plurality of output waveguide probes is positioned, at another distance from one of the plurality of second walls, as a function of the strength of the output wave signal.

5. The system of claim 1, wherein the at least one probe property that is different from at least one probe property of another one of the plurality of output waveguide probes comprises one of the following:
 a depth that a particular output waveguide probe extends into the output waveguide and a size of a probe reactant associated with the particular output waveguide probe.

6. The system of claim 1, wherein the plurality of devices comprise power amplifiers.

7. The system of claim 1, wherein the at least one probe property that is different from at least one probe property of another one of the plurality of output waveguide probes includes a sheath of at least one of a conducting or an insulating material that surrounds a particular output waveguide probe.

8. The system of claim 1, wherein the plurality of output waveguide probes includes metal traces printed on a circuit board material.

9. The system of claim 8, wherein the at least one probe property that is different from at least one probe property of another one of the plurality of output waveguide probes includes a shape of the metal traces printed on the circuit board material.

10. The system of claim 8, wherein the at least one probe property that is different from at least one probe property of another one of the plurality of output waveguide probes includes a dielectric constant circuit board material.

11. The system of claim 8, wherein the at least one probe property that is different from at least one probe property of another one of the plurality of output waveguide probes includes a thickness of the circuit board material.

12. A multi-probe power combiner system for equalizing an amplitude balance of a signal, the system comprising:
- a first waveguide defining a direction of energy propagation toward an opening thereof;
- a second waveguide defining another direction of energy propagation toward another opening thereof;
- a first set of a plurality of waveguide probes disposed in the first waveguide and a second set of the plurality of wavequide probes disposed in the second wavequide, the first set of the plurality of waveguide probes coupled to the second set of the plurality of waveguide probes via a plurality of devices for receiving the signal, wherein the first set of the plurality of waveguide probes are disposed in positions of the first waveguide so that a coupling amplitude and phase of one of the first set of the plurality of the waveguide probes is sufficiently similar to a coupling amplitude and phase of each other of the first set of the plurality of waveguide probes in the first waveguide and one of the first set of the plurality of waveguide probes is positioned in the waveguide as a function of at least one probe property of another of the first set of the plurality of waveguide probes.

13. The system of claim 12, further comprising a plurality of power amplifiers, each of the plurality of power amplifiers coupled to the plurality of waveguide probes.

14. The system of claim 12, wherein the at least one probe property includes at least one of the following of each of the plurality of waveguide probes: a location, a size, material properties, a shape of metal traces printed on a circuit board material, a sheath of at least one of a conducting or an insulating material that surrounding thereof, a dielectric constant circuit board material, a thickness of the circuit board material.

15. The system of claim 12, wherein the second set of the plurality of waveguide probes are disposed in positions of the second waveguide so that a coupling amplitude and phase of one of the second set of the plurality of the waveguide probes is sufficiently similar to a coupling amplitude and phase of each other of the second set of the plurality of waveguide probes in the second waveguide.

16. A multi-probe power combiner apparatus for equalizing an amplitude balance of a signal, the apparatus comprising:
- an input waveguide defining a first direction of energy propagation toward an input opening thereof;
- an output waveguide defining a second direction of energy propagation toward an output opening thereof;
- a plurality of input waveguide probes disposed in the input waveguide, each of the plurality of input waveguide probes including at least one probe property; and
- a plurality of output waveguide probes disposed in the output waveguide, each of the plurality of output waveguide probes including at least one probe property, wherein the plurality of output waveguide probes is positioned in the output waveguide as a function of having the at least one probe property of the plurality of output waveguide probes being different from one another, and the plurality of input waveguide probes are disposed in positions of the input waveguide so that a coupling amplitude and phase of one of the plurality of the input waveguide probes is sufficiently similar to a coupling amplitude and phase of each other of the plurality of input waveguide probes in the input waveguide.

17. The apparatus of claim 16, further comprising a plurality of power amplifiers, each of the plurality of power amplifiers connecting an input to at least one of the plurality of input waveguide probes and an output to at least one of the plurality of output waveguide probes.

18. The apparatus of claim 17, wherein the plurality of power amplifiers connects to an equal number of the plurality of input waveguide probes and the plurality of output waveguide probes.

19. The apparatus of claim 16, wherein the at least one probe property includes at least one of the following of each of the plurality of input waveguide probes or each of the plurality of output waveguide probes: a location, a size, material properties, a shape of metal traces printed on a circuit board material, a sheath of at least one of a conducting or an insulating material that surrounding thereof, a dielectric constant circuit board material, a thickness of the circuit board material.

20. The apparatus of claim 16, wherein the plurality of output waveguide probes are disposed in positions of the output waveguide so that a coupling amplitude and phase of one of the plurality of the output waveguide probes is sufficiently similar to a coupling amplitude and phase of each other of the plurality of output waveguide probes in the output waveguide.

* * * * *